United States Patent
Kim et al.

(10) Patent No.: US 11,355,213 B2
(45) Date of Patent: Jun. 7, 2022

(54) APPARATUS AND METHOD FOR VERIFYING RELIABILITY OF DATA READ FROM MEMORY DEVICE THROUGH CLOCK MODULATION, AND MEMORY SYSTEM INCLUDING THE SAME

(71) Applicant: SK hynix Inc., Icheon (KR)

(72) Inventors: Hyun Sub Kim, Yongin (KR); Ie Ryung Park, Suwon (KR)

(73) Assignee: SK hynix Inc., Icheon (KR)

( * ) Notice: Subject to any disclaimer, the term of this patent is extended or adjusted under 35 U.S.C. 154(b) by 113 days.

(21) Appl. No.: 16/868,116

(22) Filed: May 6, 2020

(65) Prior Publication Data

US 2021/0241843 A1    Aug. 5, 2021

(30) Foreign Application Priority Data

Jan. 31, 2020  (KR) ........................ 10-2020-0011548

(51) Int. Cl.
*G11C 29/38* (2006.01)
*G06F 1/06* (2006.01)
(Continued)

(52) U.S. Cl.
CPC .............. *G11C 29/38* (2013.01); *G06F 1/06* (2013.01); *G11C 7/222* (2013.01); *G11C 29/12015* (2013.01)

(58) Field of Classification Search
CPC ... G11C 29/38; G11C 7/222; G11C 29/12015; G06F 1/06
See application file for complete search history.

(56) References Cited

U.S. PATENT DOCUMENTS 6,233,250 B1    5/2001  Liu et al.
6,466,736 B1 *  10/2002 Chen .................... H04N 9/8042
                                                                386/216
(Continued)

FOREIGN PATENT DOCUMENTS

KR   10-0875348 B1   12/2008
KR   100875348 B1    12/2008
(Continued)

OTHER PUBLICATIONS

Office Action dated Jul. 28, 2021 in U.S. Appl. No. 16/841,030.
(Continued)

*Primary Examiner* — Kyle Vallecillo

(57) ABSTRACT

A memory system including: a memory device looping back a first clock to generate a second clock and outputting read data that are read from a memory cell region of the memory device in synchronization with the second clock; and a memory controller generating the first clock that includes a plurality of modulation sections by performing a modulation operation on a source clock according to a specific scheme, outputting the first clock to the memory device, and receiving the read data in response to the second clock. The read data includes a plurality of section data corresponding to the plurality of modulation sections included in the second clock, respectively, and the memory controller verifies reliability of each of the plurality of section data included in the read data by performing a demodulation operation on the second clock according to the specific scheme.

19 Claims, 6 Drawing Sheets

(51) Int. Cl.
*G11C 29/12* (2006.01)
*G11C 7/22* (2006.01)

(56) References Cited

U.S. PATENT DOCUMENTS

| | | | |
|---|---|---|---|
| 6,529,571 | B1 | 3/2003 | Gaudet |
| 6,587,918 | B1 | 7/2003 | Christenson |
| 7,054,195 | B2 | 5/2006 | Matsunaga |
| 7,315,957 | B1 | 1/2008 | Wagner et al. |
| 7,464,282 | B1 | 12/2008 | Abdollahi-Alibeik et al. |
| 7,827,424 | B2 | 11/2010 | Bounitch |
| 9,142,001 | B2 | 9/2015 | Samson et al. |
| 9,405,350 | B2 | 8/2016 | Kanai et al. |
| 9,424,901 | B1 | 8/2016 | An et al. |
| 9,633,737 | B2 | 4/2017 | An |
| 10,042,416 | B2 | 8/2018 | Tzafrir et al. |
| 10,249,234 | B2 | 4/2019 | Kim |
| 10,409,357 | B1 | 9/2019 | Li et al. |
| 10,825,535 | B1 | 11/2020 | Pawlowski |
| 11,056,176 | B2 | 7/2021 | Shin |
| 2005/0201192 | A1 | 9/2005 | Honda |
| 2007/0217356 | A1* | 9/2007 | Kanno ............... H04B 1/1615 370/328 |
| 2009/0002868 | A1* | 1/2009 | Mallary ............... G11B 5/746 360/55 |
| 2009/0244756 | A1* | 10/2009 | Itakura ............... G11B 5/59688 360/31 |
| 2009/0285061 | A1* | 11/2009 | Nagai ............... G11B 20/14 369/47.3 |
| 2014/0023169 | A1 | 1/2014 | Valiani et al. |
| 2016/0062930 | A1 | 3/2016 | Kijima et al. |
| 2017/0062065 | A1 | 3/2017 | Shim et al. |
| 2017/0351316 | A1 | 12/2017 | Milena et al. |
| 2018/0165023 | A1 | 6/2018 | Oh et al. |
| 2019/0050159 | A1 | 2/2019 | Jung et al. |
| 2019/0354300 | A1 | 11/2019 | Benisty et al. |
| 2020/0159435 | A1 | 5/2020 | Walker et al. |
| 2020/0294571 | A1 | 9/2020 | Shin |

FOREIGN PATENT DOCUMENTS

| | | |
|---|---|---|
| KR | 10-0940611 B1 | 2/2010 |
| KR | 100940611 B1 | 2/2010 |
| KR | 20110004165 A | 1/2011 |
| KR | 101620348 B1 | 5/2016 |

OTHER PUBLICATIONS

Office Action dated Dec. 3, 2021 in U.S. Appl. No. 16/888,492.
Office Action dated Oct. 14, 2021 in related U.S. Appl. No. 16/888,444.

* cited by examiner

APPARATUS AND METHOD FOR VERIFYING RELIABILITY OF DATA READ FROM MEMORY DEVICE THROUGH CLOCK MODULATION, AND MEMORY SYSTEM INCLUDING THE SAME

CROSS-REFERENCE TO RELATED APPLICATION

The present application claims priority of Korean Patent Application No. 10-2020-0011548, filed on Jan. 31, 2020, which is incorporated herein by reference in its entirety.

BACKGROUND

1. Field

Embodiments of the present disclosure relate to a memory device for verifying the reliability of read data through clock modulation and clock demodulation, and a memory system including the memory device.

2. Description of the Related Art

Semiconductor memory devices for storing data may be largely divided into volatile memory devices and non-volatile memory devices. Volatile memory devices such as a Dynamic Random Access Memory (DRAM) in which data are stored by charging or discharging to/from a cell capacitor may retain data while power is supplied thereto but lose the data stored therein when the power is cut off.

However, non-volatile memory devices such as a flash memory may retain data even when power is cut off. A volatile memory device is mainly used as a main memory of a computer and the like, while a non-volatile memory device is used as a large-capacity memory for storing programs and data in a wide range of application devices, such as computers and portable communication devices.

As the fabrication technology makes progress, the memory capacity of a memory device is increasing and the data transfer rate between a memory device and a memory controller is increasing as well. In general, a data clock in addition to an internal clock used in a memory device or a memory controller may be used for efficient data transfer between the memory device and the memory controller. In other words, the data clock may be used exclusively for data transfer between the memory device and the memory controller. Therefore, the data transferred between the memory device and the memory controller may be in synchronization with the data clock.

SUMMARY

Embodiments of the present disclosure are directed to a memory device capable of verifying the reliability of read data through clock modulation and clock demodulation, and a memory system including the memory device.

In accordance with an embodiment of the present disclosure, a memory system includes: a memory device including a memory cell region for storing data, the memory device looping back a first clock to generate a second clock and outputting read data that are read from the memory cell region in synchronization with the second clock; and a memory controller generating the first clock that includes a plurality of modulation sections by performing a modulation operation on a source clock according to a specific scheme, for outputting the first clock to the memory device, and for receiving the read data in response to the second clock. the read data may include a plurality of section data corresponding to the plurality of modulation sections included in the second clock, respectively, and the memory controller may verify reliability of each of the plurality of section data included in the read data by performing a demodulation operation on the second clock according to the specific scheme.

The modulation operation according to the specific scheme may include a frequency modulation operation using a plurality of frequencies. Each of the plurality of modulation sections included in the first clock may be detected based on a frequency difference.

The modulation operation according to the specific scheme may include a phase modulation operation using a plurality of phases. Each of the plurality of modulation sections included in the first clock may be detected based on a phase difference.

The memory controller may detect the plurality of modulation sections included in the second clock through the demodulation operation, and may verify whether one or more abnormal section data exist among the plurality of section data.

When the abnormal section data exist among the plurality of section data, the memory controller may request the memory device to selectively re-read and output the abnormal section data from the memory cell region.

The memory controller may include: a clock generator generating the source clock; a modulation circuit generating the first clock by performing the modulation operation on the source clock; an input circuit receiving the read data in response to the second clock; and a verification circuit verifying the reliability of the read data inputted through the input circuit by performing the demodulation operation on the second clock.

In accordance with another embodiment of the present invention, a memory system may include: a memory device including a memory cell region for storing data, the memory device generating a modulation clock by performing a modulation operation on an externally inputted source clock according to a specific scheme, the modulation clock including a plurality of modulation sections, and outputting the modulation clock and read data that are read from the memory cell region in synchronization with the modulation clock; and a memory controller generating the source clock and outputting the source clock to the memory device, and for receiving the read data in response to the modulation clock. The read data may include a plurality of section data corresponding to the plurality of modulation sections included in the modulation clock, respectively, and the memory controller may verify reliability of each of the plurality of section data included in the read data by performing a demodulation operation on the modulation signal according to the specific scheme.

The modulation operation according to the specific scheme may include a frequency modulation operation using a plurality of frequencies. Each of the plurality of modulation sections included in the modulation clock may be detected based on a frequency difference.

The modulation operation according to the specific scheme may include a phase modulation operation using a plurality of phases. Each of the plurality of modulation sections included in the modulation clock may be detected based on a phase difference.

The memory controller may detect the plurality of modulation sections included in the modulation clock through the demodulation operation, and may verify whether one or more abnormal section data exist among the plurality of section data.

When the abnormal section data exist among the plurality of section data, the memory controller may request the memory device to selectively re-read and output the abnormal section data from the memory cell region.

The memory device may further include: a modulation circuit generating the modulation clock by performing the modulation operation on the source clock; and an output circuit outputting the read data read from the memory cell region in synchronization with the modulation clock.

The memory controller may include: a clock generator generating the source clock; an input circuit receiving the read data in response to the modulation clock; and a verification circuit verifying the reliability of the read data inputted through the input circuit by performing the demodulation operation on the modulation clock.

In accordance with yet another embodiment of the present invention, A method for operating a memory system including a memory device having a memory cell region for storing data, the method may include: generating a modulation clock by performing a modulation operation on a source clock according to a specific scheme, the modulation clock including a plurality of modulation sections; outputting read data that are read from the memory cell region in synchronization with the modulation clock from the memory device, the read data including a plurality of section data corresponding to the plurality of modulation sections included in the modulation clock, respectively; and verifying reliability of each of the plurality of section data included in the read data by performing a demodulation operation on the modulation signal according to the specific scheme.

The modulation operation according to the specific scheme may include a frequency modulation operation using a plurality of frequencies. Each of the plurality of modulation sections included in the modulation clock may be detected based on a frequency difference.

The modulation operation according to the specific scheme may include a phase modulation operation using a plurality of phases. Each of the plurality of modulation sections included in the modulation clock may be detected based on a phase difference.

The verifying of the reliability of the read data may be: detecting the plurality of modulation sections included in the modulation clock through the demodulation operation; and verifying whether one or more abnormal section data exist among the plurality of section data.

The method may further include when the abnormal section data exist among the plurality of section data in the verifying of the reliability of the read data, selectively re-reading the abnormal section data from the memory cell region and outputting the re-read abnormal section data from the memory device.

The method may further include after generating the modulation clock outside the memory device, transferring the generated modulation clock to the memory device. The memory device may loop back the transferred modulation clock and may output the read data that are read from the memory cell region in synchronization with the modulation clock from the memory device.

The method may further include: generating the source clock outside the memory device; and transferring the source clock to the memory device. The memory device may generate the modulation clock based on the transferred source clock, and may output the read data that are read from the memory cell region in synchronization with the modulation clock from the memory device.

DETAILED DESCRIPTION

Figure 1:
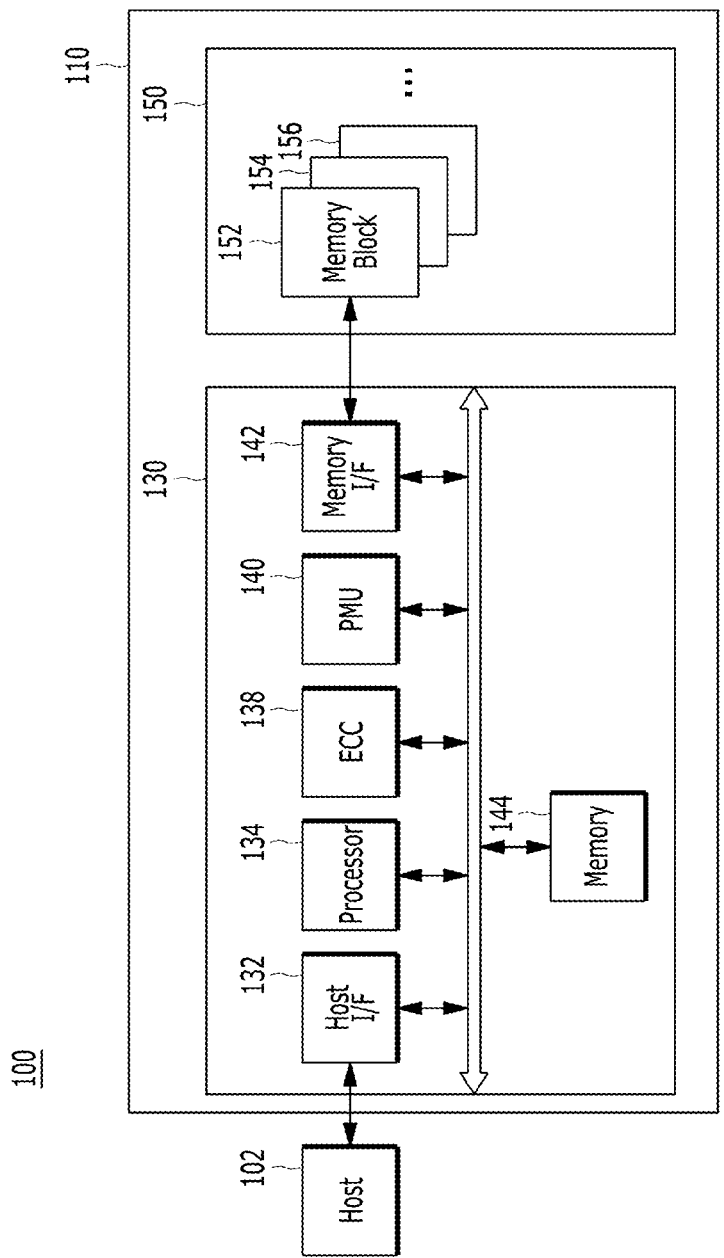
FIG. 1 is a block diagram illustrating a data processing system including a memory system in accordance with an embodiment of the present disclosure.

Various examples of the disclosure are described below in more detail with reference to the accompanying drawings. Aspects and features of examples of the present disclosure, however, may be embodied in different ways to form other embodiments, including variations of any of the disclosed embodiments. Thus, embodiments of the present disclosure are not to be construed as being limited to the embodiments set forth herein. Rather, the described embodiments are provided so that this disclosure is thorough and complete and fully conveys the disclosure to those skilled in the art to which this invention pertains. Throughout the disclosure, like reference numerals refer to like parts throughout the various figures and examples of the disclosure. It is noted that reference to "an embodiment," "another embodiment," or the like does not necessarily mean only one embodiment, and different references to any such phrase are not necessarily to the same embodiment(s).

It will be understood that, although the terms "first," "second," "third," and so on may be used herein to identify various elements, these elements are not limited by these terms. These terms are used to distinguish one element from another element that otherwise have the same or similar names. Thus, a first element in one instance could be termed as a second or third element in another instance without departing from the spirit and scope of the invention.

The drawings are not necessarily to scale and, in some instances, proportions may have been exaggerated in order to clearly illustrate features of the embodiments. When an element is referred to as being connected or coupled to another element, the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention belongs in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail below with reference to the accompanying drawings, wherein like numbers reference like elements.

FIG. 1 is a block diagram illustrating a data processing system 100 including a memory system 110 in accordance with an embodiment of the present disclosure.

Referring to FIG. 1, the data processing system 100 may include a host 102 operably coupled with a memory system 110.

The host 102 may include any of a variety of portable electronic devices, such as a mobile phone, an MP3 player, and a laptop computer, or an electronic device such as a desktop computer, a game player, a television (TV), a projector, and the like.

The host 102 also includes at least one operating system (OS), which can generally manage, and control functions and operations performed in the host 102. The OS may provide interoperability between the host 102 coupled with the memory system 110 and the user of the memory system 110. The OS may support functions and operations corresponding to user's requests. By way of example but not limitation, the OS may include a general operating system and a mobile operating system according to mobility of the host 102. The general operating system may be split into a personal operating system and an enterprise operating system according to system requirements or user's environment. The personal operating system, including Windows and Chrome, may be subject to support services for general purposes. The enterprise operating systems may be specialized for securing and supporting high performance, including Windows servers, Linux, and Unix. Further, the mobile operating system may include an Android and iOS. The mobile operating system may be subject to support services or functions for mobility (e.g., a power saving function). The host 102 may include a plurality of operating systems. The host 102 may execute multiple operating systems in cooperation with the memory system 110, corresponding to a user's request. The host 102 may transmit a plurality of commands corresponding to the user's requests to the memory system 110, thereby performing operations corresponding to commands within the memory system 110. Handling plural commands in the memory system 110 will be described below with reference to FIGS. 4 and 5.

The memory system 110 may perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, and a memory stick.

The storage devices for the memory system 110 may be implemented with a volatile memory device, for example, a dynamic random access memory (DRAM) or a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), or a flash memory.

The memory system 110 may include a controller (or a memory controller) 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as described above.

By way of example but not limitation, the controller 130 and the memory device 150 may be integrated into a single semiconductor device. The controller 130 and memory device 150 may be integrated to form an SSD with improved operation speed. When the memory system 110 is used as an SSD, the operating speed of a host 102 connected to the memory system 110 can be faster than that of a host 102 connected with a hard disk. In another embodiment, the controller 130 and the memory device 150 may be integrated into one semiconductor device to form a memory card, such as a PC card (PCMCIA), a compact flash card (CF), a smart media card (e.g., SM, SMC), a memory stick, a multimedia card (e.g., MMC, RS-MMC, MMCmicro), a secure digital (SD) card (e.g., SD, miniSD, microSD, SDHC), or a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided from the host 102 through a write operation, while providing data stored therein to the host 102 through a read operation. The memory device 150 may include a plurality of memory blocks 152, 154, and 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes memory blocks, among the plurality of memory blocks 152, 154, and 156. In addition, the memory device 150 may be a non-volatile memory device, for example a flash memory, and the flash memory may have a three-dimensional stack structure.

The controller 130 may control overall operations of the memory device 150, such as read, write, program and erase operations. For example, the controller 130 may control the memory device 150 in response to a request from the host 102. The controller 130 may provide data read from the memory device 150 to the host 102. The controller 130 may store data provided by the host 102 in the memory device 150.

The controller 130 may include a host interface (I/F) 132, a processor 134, error correction code (ECC) unit 138, a power management unit (PMU) 140, a memory interface (I/F) 142, and a memory 144, all operatively coupled via an internal bus.

The host interface 132 may process commands and data provided from the host 102, and may communicate with the host 102 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). In accordance with an embodiment, the host interface 132 is a component for exchanging data with the host 102, which may be implemented through firmware called a host interface layer (HIL).

The ECC unit 138 may correct error bits of the data to be processed in (e.g., outputted from) the memory device 150, which may include an ECC encoder and an ECC decoder. Here, the ECC encoder may perform error correction encoding of data to be programmed in the memory device 150 to generate encoded data into which a parity bit is added and store the encoded data in memory device 150. The ECC decoder may detect and correct errors contained in data read from the memory device 150 when the controller 130 reads the data stored in the memory device 150. In other words, after performing error correction decoding on the data read from the memory device 150, the ECC unit 138 may determine whether the error correction decoding has succeeded and output an instruction signal (e.g., a correction success signal or a correction fail signal). The ECC unit 138 may use the parity bit which is generated during the ECC encoding process, for correcting the error bit of the read data. When the number of error bits is greater than or equal to a threshold number of correctable error bits, the ECC unit 138 may not correct error bits but instead may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), or a Block coded modulation (BCM). The ECC unit 138 may include any and all circuits, modules, systems or devices for performing the error correction operation based on at least one of the above described codes.

The PMU 140 may manage electrical power in the controller 130. For example, the PMU 140 may detect power-on and power-off. In addition, the PMU 140 may include a power detector.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 may provide an interface for handling commands and data between the controller 130 and the memory device 150, for example, to perform operations of NAND flash interface, in particular, operations between the controller 130 and the memory device 150. In accordance with an embodiment, the memory interface 142 may be implemented through firmware called a flash interface layer (FIL) as a component for exchanging data with the memory device 150.

The memory 144 may support operations performed by the memory system 110 and the controller 130. The memory 144 may store temporary or transactional data generated or delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may store data used by the controller 130 and the memory device 150 to perform operations such as read operations or program/write operations.

Figure 2:
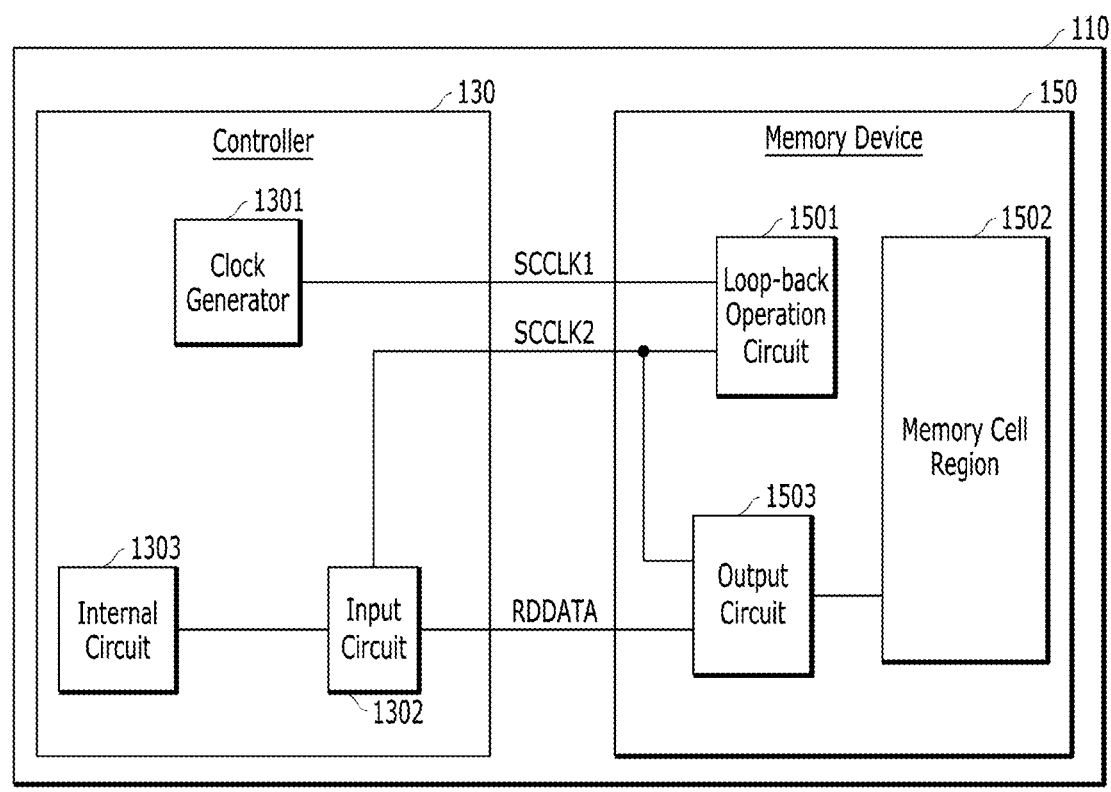
FIG. 2 is a block diagram illustrating an operation of a memory system in accordance with an embodiment of the present disclosure.

The memory 144 may be a volatile memory. The memory 144 may be implemented with a static random access memory (SRAM), a dynamic random access memory (DRAM), or both. Although FIG. 2 shows the memory 144 disposed within the controller 130, embodiments are not limited to that arrangement. That is, the memory 144 may be within or external to the controller 130. For instance, the memory 144 may be an external volatile memory having a memory interface transferring data and/or signals between the memory 144 and the controller 130.

The memory 144 may store data for performing operations such as data writing and data reading requested by the host 102 and/or data transfer between the memory device 150 and the controller 130 for background operations such as garbage collection and wear levelling. In accordance with an embodiment, for supporting operations in the memory system 110, the memory 144 may include a program memory, a data memory, a write buffer/cache, a read buffer/cache, a data buffer/cache, and a map buffer/cache.

The processor 134 may be a microprocessor or a central processing unit (CPU). The memory system 110 may include one or more processors 134. The processor 134 may control the overall operations of the memory system 110. By way of example but not limitation, the processor 134 can control a program operation or a read operation of the memory device 150, in response to a write request or a read request entered from the host 102. In accordance with an embodiment, the processor 134 may use or execute firmware to control the overall operations of the memory system 110. Herein, the firmware may be a flash translation layer (FTL). The FTL may serve as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may load, generate, update, or store map data. Therefore, the controller 130 may map a logical address, which is entered from the host 102, with a physical address of the memory device 150 through the map data. The memory device 150 may function as a general storage device to perform a read or write operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the particular page to the newly programed page) due to a characteristic of a flash memory device. Further, the controller 130 may store map data of the new data into the FTL.

For example, when performing an operation requested from the host 102 in the memory device 150, the controller 130 uses the processor 134. The processor 134 engaged with the memory device 150 may handle instructions or commands corresponding to an inputted command from the host 102. The controller 130 may perform a foreground operation as a command operation, corresponding to a command from the host 102, such as a program operation corresponding to a write command, a read operation corresponding to a read command, an erase/discard operation corresponding to an erase/discard command, and a parameter set operation corresponding to a set parameter command or a set feature command with a set command.

The controller 130 may perform a background operation on the memory device 150 through the processor 134. By way of example but not limitation, the background operation for the memory device 150 includes copying data in a memory block, among the memory blocks 152, 154, and 156, and storing such data in another memory block, for example, a garbage collection (GC) operation. The background operation may include an operation to move data stored in at least one of the memory blocks 152, 154, and 156 in the memory device 150, into at least another of the memory blocks 152, 154, and 156, for example, a wear leveling (WL) operation. During a background operation, the controller 130 may use the processor 134 for storing the map data stored in the controller 130 to at least one of the memory blocks 152, 154, and 156, for example, a map flush operation. A bad block management operation of checking for bad blocks among the plurality of memory blocks 152, 154, and 156 is another example of a background operation performed by the processor 134.

In the memory system 110, the controller 130 performs a plurality of command operations corresponding to a plurality of commands received from the host 102. For example, when performing a plurality of program operations corresponding to plural program commands, a plurality of read operations corresponding to plural read commands, and a plurality of erase operations corresponding to plural erase commands sequentially, randomly, or alternatively, the controller 130 may determine which channel(s) or way(s) for connecting the controller 130 to which memory die(s) in the memory 150 is/are proper or appropriate for performing each operation. The controller 130 may transmit data or instructions via the channel(s) or way(s) for performing each operation. The plurality of memory dies may transmit an operation result via the same channel(s) or way(s), respectively, after each operation is complete. Then, the controller 130 may transmit a response or an acknowledge signal to the host 102. In an embodiment, the controller 130 may check a status of each channel or each way. In response to a command received from the host 102, the controller 130 may select at least one channel or way based on the status of each channel or each way so that instructions and/or operation results with data may be delivered via selected channel(s) or way(s).

The controller 130 may check the states of a plurality of channels (or ways) coupled to a plurality of memory dies that are included in the memory device 150.

By way of example but not limitation, the controller 130 may recognize statuses regarding channels (or ways) associated with memory dies in the memory device 150. The controller 130 may determine each channel or each way as being in a busy state, a ready state, an active state, an idle state, a normal state, or an abnormal state. The controller's determination of which channel or way an instruction (and/or data) is delivered through can be based on a physical block address, e.g., to which die(s) the instruction (and/or the data) is delivered. The controller 130 may refer to descriptors delivered from the memory device 150. The descriptors may include a block or page of parameters that describe characteristics of the memory device 150, and may have a set format or structure. The descriptors may include device descriptors, configuration descriptors, unit descriptors, and the like. The controller 130 can refer to, or use, the descriptors to determine with which channel(s) or way(s) an instruction or a data is exchanged.

A management unit (not shown) may be included in the processor 134. The management unit may perform bad block management of the memory device 150. The management unit may find bad memory blocks, which are in unsatisfactory condition for further use, as well as perform bad block management on the bad memory blocks. When the memory device 150 is a flash memory such as a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may substantially reduce the utilization efficiency of the memory device 150 having a 3D stack structure and the reliability of the memory system 110. Thus, reliable bad block management may enhance or improve performance of the memory system 110.

FIG. 2 is a block diagram illustrating an operation of a memory system 110 in accordance with an embodiment of the present invention.

Referring to FIG. 2, the memory system 110 may include a controller 130 and a memory device 150. The controller 130 may include a clock generator 1301, an input circuit 1302, and an internal circuit 1303. The memory device 150 may include a loop-back operation circuit 1501, a memory cell region 1502, and an output circuit 1503. The clock generator 1301 and the input circuit 1302 that are included in the controller 130 may be constituent elements corresponding to the memory interface unit 142 described as the constituent elements included in the controller 130 shown in FIG. 1. Also, the internal circuit 1303 included in the controller 130 may be a constituent element corresponding to one or more of the host interface unit 132, the processor 134, the error correction code (ECC) unit 138, the power management unit (PMU) 140, and the memory 144, which are described as the constituent elements included in the controller 130 in FIG. 1. The memory cell region 1502 included in the memory device 150 may be a constituent element corresponding to the memory blocks 152, 154, and 156 that are described in FIG. 1 to be included in the memory device 150. Also, it is illustrated in the drawing that one memory device 150 is included in the memory system 110. This is merely an example, and the memory system 110 may also include more than one memory devices.

To be specific, the memory device 150 may include a memory cell region 1502 for storing data, and the memory device 150 may loop back an external first source clock SCCLK1 to output a second source clock SCCLK2. Herein, the memory device 150 may synchronize read data RDDATA, which is read from the memory cell region 1502, with the second source clock SCCLK2 and output the resultant read data.

To be more specific, the memory device 150 may read the read data RDDATA from the memory cell region 1502 in response to a read command (not shown) inputted from the controller 130. Also, the memory device 150 may synchronize the read data RDDATA with the second source clock SCCLK2 which is obtained by looping back the first source clock SCCLK1 inputted from the controller 130 and output the synchronized read data. In other words, the loop-back operation circuit 1501 included in the memory device 150 may output the second source clock SCCLK2, which is obtained by looping back the first source clock SCCLK1 inputted from the controller 130, to the controller 130. Also, the output circuit 1503 included in the memory device 150 may output the read data RDDATA that is read from the memory cell region 1502 to the controller 130 in synchronization with the second source clock SCCLK2.

Herein, loop-back may refer to routing an input signal, digital data streams, or flows of items without intentional processing or modification.

The controller 130 may generate the first source clock SCCLK1, output the first source clock SCCLK1 to the memory device 150, and then receive the read data RDDATA which is transferred from the memory device 150 in response to the second source clock SCCLK2 which is transferred from the memory device 150.

To be more specific, the clock generator 1301 included in the controller 130 may generate the first source clock SCCLK1 and output the generated first source clock SCCLK1 to the memory device 150. The input circuit 1302 included in the controller 130 may receive the read data RDDATA which is transferred from the memory device 150 in response to the second source clock SCCLK2 which is transferred from the memory device 150. The internal circuit 1303 included in the controller 130 may use the read data RDDATA inputted through the input circuit 1302 according to a predetermined purpose. For example, the internal circuit 1303 may perform an operation of outputting the read data RDDATA to the host 102 in FIG. 1 in response to the host interface unit 132 in FIG. 1 and the processor 134 in FIG. 1.

Meanwhile, the size of the read data RDDATA requested by the controller 130 to the memory device 150 through one read command may have a predetermined size. For example, the predetermined size for the read data RDDATA may be approximately 2 KB. Herein, the predetermined size for the read data RDDATA may vary depending on the type of the memory device 150 or the selection of a designer.

Also, in order for the controller 130 to request the memory device 150 for data having a larger or smaller size than the predetermined size for the read data RDDATA, an additional operation may be required as shown in the following example.

For example, when the predetermined size for the read data RDDATA is approximately 2 KB and data of a size of approximately 10 KB which is larger than the predetermined size are to be read from the memory device 150, the controller 130 may transfer five read commands to the memory device 150 and then receive five read data RDDATAs each having a size of approximately 2 KB from the memory device 150.

Also, when the predetermined size for the read data RDDATA is approximately 2 KB and data of a size of approximately 512 bytes, which is smaller than the predetermined size, is to be read from the memory device 150, selection information for selecting data of approximately 512 bytes from the read data RDDATA of 2 KB corresponding to a single read command may be included in the single read command that is transferred to the memory device 150. In other words, the controller 130 may transfer the single read command including the selection information to the memory device 150 and then receive read data RDDATA of approximately 512 bytes from the memory device 150.

Meanwhile, when the read data RDDATA are read from the memory cell region 1502 included in the memory device 150, errors may occur in some bits. Also, the values of some bits may be lost or an error may occur while the read data RDDATA are outputted from the memory device 150 and transferred to the controller 130. As described above, some bits of the read data RDDATA transferred from the memory device 150 to the controller 130 may not be in a normal state, that is, errors may occur or the values of some bits may be lost. In this case, the controller 130 may control the memory device 150 to re-read the read data RDDATA from the memory cell region 1502 and output the read data RDDATA that are re-read.

Herein, since the read data RDDATA have a predetermined size, when it is determined that some abnormal bits are included in the read data RDDATA received from the memory device 150, the controller 130 may request the memory device 150 to read and transfer the read data RDDATA of the predetermined size again.

When the read data RDDATA are read back from the memory device 150 because some abnormal bits are included in the read data RDDATA, a portion of the read data RDDATA including the abnormal bits and having a given size smaller than a predetermined size can be read again and transferred to the controller 130. In this case, an operation of re-reading the portion of the read data RDDATA and transferring the portion of the read data RDDATA to the controller 130 may be more efficient than an operation of re-reading the entire read data RDDATA of the predetermined size and transferring the entire read data RDDATA to the controller 130. In order to efficiently perform the operation, the operation of selecting data of the given size including the abnormal bits from the read data RDDATA of the predetermined size and controlling the memory device 150 to read the selected data may be required. This may be realized through the following embodiments of the present invention.

Herein, when it is determined that some abnormal bits are included in the read data RDDATA received from the memory device 150, the controller 130 may include an error correction code unit (e.g., the ECC unit 138 in FIG. 1) and perform a recovery operation of recovering the read data RDDATA in an abnormal state into a normal state in the error correction code unit 138. For example, the ECC unit 138 may be included in the internal circuit 1303. However, the recovery operation of the error correction code unit 138 may require a relatively longer time than the repetitive read operation of re-reading the read data RDDATA from the memory device 150 and transferring the read data RDDATA to the controller 130. Therefore, when the read data RDDATA are still in the abnormal state even after the repetitive read operation of re-reading the read data RDDATA from the memory device 150 and transferring the read data RDDATA to the controller 130 is performed a predetermined number of times that is set by the designer, the recovery operation may be attempted through the error correction code unit 138.

Figure 3:
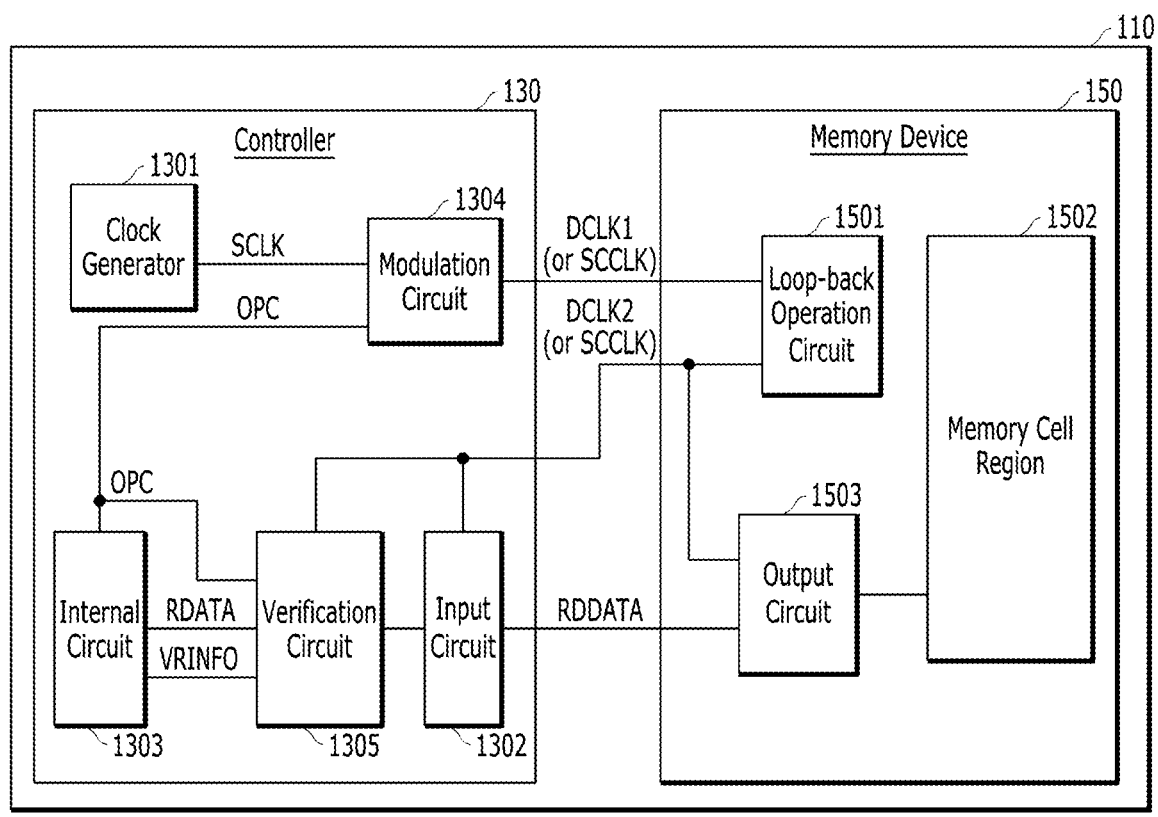
FIG. 3 is a block diagram illustrating an operation of a memory system in accordance with an embodiment of the present disclosure.

FIG. 3 is a block diagram illustrating an operation of a memory system 110 in accordance an embodiment of the present disclosure.

Referring to FIG. 3, the memory system 110 may include a controller 130 and a memory device 150. Herein, the controller 130 may include a clock generator 1301, an input circuit 1302, an internal circuit 1303, a modulation circuit 1304, and a verification circuit 1305. The memory device 150 may include a loop-back operation circuit 1501, a memory cell region 1502, and an output circuit 1503. Herein, the clock generator 1301, the input circuit 1302, the modulation circuit 1304, and the verification circuit 1305 included in the controller 130 may be constituent elements corresponding to the memory interface unit 142 that are described in FIG. 1 as the constituent elements included in the controller 130. Also, the internal circuit 1303 included in the controller 130 may be a constituent element corresponding to one or more of the host interface unit 132, the processor 134, the error correction code (ECC) unit 138, the power management unit (PMU) 140, and the memory 144 that are described in FIG. 1 as the constituent elements included in the controller 130. The memory cell region 1502 included in the memory device 150 may be a constituent element corresponding to a plurality of memory blocks 152, 154, and 156 that are described in FIG. 1 as the constituent elements included in the memory device 150. Also, it is described in the drawing that one memory device 150 is included in the memory system 110. However, embodiments of the present disclosure are not limited thereto. For example, a plurality of memory devices may be included in the memory system 110.

To be specific, the memory device 150 may include a memory cell region 1502 for storing data, and the memory device 150 may loop back an externally inputted first modulation clock DCLK1 to output a second modulation clock DCLK2. In this case, the memory device 150 may synchronize read data RDDATA that are read from the memory cell region 1502 with the second modulation clock DCLK2 and output resultant synchronized data.

To be more specific, the memory device 150 may read the read data RDDATA from the memory cell region 1502 in response to a read command (not shown) inputted from the controller 130. Also, the memory device 150 may synchronize the read data RDDATA with the second modulation clock DCLK2 that is obtained by looping back the first modulation clock DCLK1 inputted from the controller 130 and output the resultant synchronized data. In other words, the loop-back operation circuit 1501 included in the memory device 150 may obtain the second modulation clock DCLK2 by looping back the first modulation clock DCLK1 inputted from the controller 130 and output the second modulation clock DCLK2 to the controller 130. Also, the output circuit 1503 included in the memory device 150 may output the read data RDDATA that are read from the memory cell region 1502 to the controller 130 in synchronization with the second modulation clock DCLK2.

Herein, the word 'loop-back' (or loopback) may refer to routing an input signal that is received, digital data streams, or flows of items without intentional processing or modification. In an embodiment, the loop-back operation circuit 1501 may be implemented as a circuit that couples a first channel receiving the first modulation clock DCLK1 and a second channel transmitting the second modulation clock DCLK2. For example, the circuit may include a unity-gain buffer coupled between the first channel and the second channel.

The controller 130 may generate a first modulation clock DCLK1 which is divided into N consecutive modulation sections by performing a modulation operation on the source clock SCCLK according to a specific scheme, output the generated first modulation clock DCLK1 to the memory device 150, and then receive the read data RDDATA transferred from the memory device 150 in response to the second modulation clock DCLK2 transferred from the memory device 150. Herein, N may be a natural number equal to or greater than 2. Also, the controller 130 may verify the reliability of the read data RDDATA corresponding to the N modulation sections included in the second modulation clock DCLK2 for each modulation section through a demodulation operation according to a specific scheme.

Herein, the operation of verifying the reliability of the read data RDDATA in the controller 130 may include an operation of verifying whether or not abnormal data are included in the read data RDDATA inputted through the input circuit 1302. In other words, the controller 130 may detect each of the N modulation sections included in the second modulation clock DCLK2 by performing a demodulation operation on the second modulation clock DCLK2 according to a specific scheme, and verify whether there is an abnormal section data or not among the N section data (not shown) that are included in the read data RDDATA and respectively corresponding to the N modulation sections in the second modulation clock DCLK2. For example, abnormal section data in the read data RDDATA may include one or more abnormal bits.

To be more specific, the clock generator 1301 included in the controller 130 may generate a source clock SCCLK. Also, the modulation circuit 1304 included in the controller 130 may generate a first modulation clock DCLK1 including N modulation sections by performing a modulation operation on the source clock SCCLK according to a specific scheme, and then output the first modulation clock DCLK1 to the memory device 150. In an embodiment, the modulation circuit 1304 is implemented as a circuit including a frequency modulation circuit. For example, the modulation circuit 1304 may include a frequency modulator that receives a DC input and generates the first modulation signal DCLK1 in response to the DC input by varying a value of the DC input to generate the N modulation sections of the first modulation signal DCLK1 having different frequencies. The input circuit 1302 included in the controller 130 may receive the read data RDDATA transferred from the memory device 150 in response to the second modulation clock DCLK2 transferred from the memory device 150. Also, the verification circuit 1305 included in the controller 130 may verify the reliability of the read data RDDATA corresponding to the N modulation sections that are included in the second modulation clock DCLK2 for each modulation section by performing a demodulation operation on the second modulation clock DCLK2 which is transferred from the memory device 150 according to a specific scheme.

The internal circuit 1303 included in the controller 130 may perform an operation for securing the reliability of the read data RDDATA inputted through the input circuit 1302 based on the verification information VRINFO outputted from the verification circuit 1305, and then use the read data RDDATA inputted through the input circuit 1302 according to a predetermined purpose.

Herein, the operation that may be performed in the internal circuit 1303 to secure the reliability of the read data RDDATA inputted through the input circuit 1302 may be an operation of requesting the memory device 150 to selectively re-read and output only abnormal section data from the memory cell region 1502 among N section data included in the read data RDDATA respectively corresponding to the N modulation sections included in the second modulation clock DCLK2. In short, when it is assumed that the read data RDDATA have a predetermined size, it may be an operation of requesting the memory device 150 to re-read only some abnormal section data among the N section data included in the read data RDDATA.

For example, although not illustrated in detail in the drawing, the internal circuit 1303 may generate a read command for selectively re-reading abnormal section data and transfer the generated read command to the memory device 150. Subsequently, when the section data that are requested to be re-read are transferred to the controller 130 and the reliability is verified by the verification circuit 1305, the internal circuit 1303 may use the entire read data RDDATA including the re-read section data for a predetermined purpose. For example, referring back to FIG. 1, the internal circuit 1303 may perform an operation for outputting the read data RDDATA to the host 102 communicating with the host interface unit 132 and the processor 134.

Figure 5:
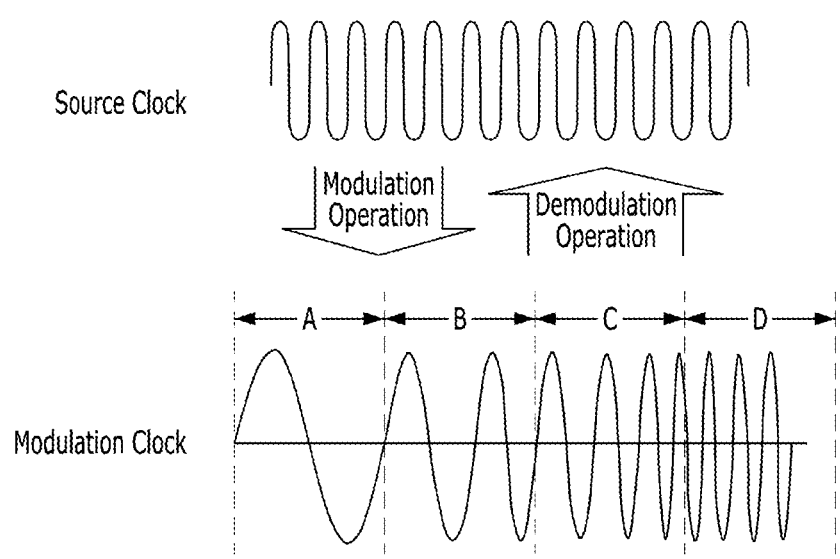
FIGS. 5 and 6 are waveform diagrams illustrating a clock modulation operation used in a memory system in accordance with an embodiment of the present disclosure.
Figure 6:
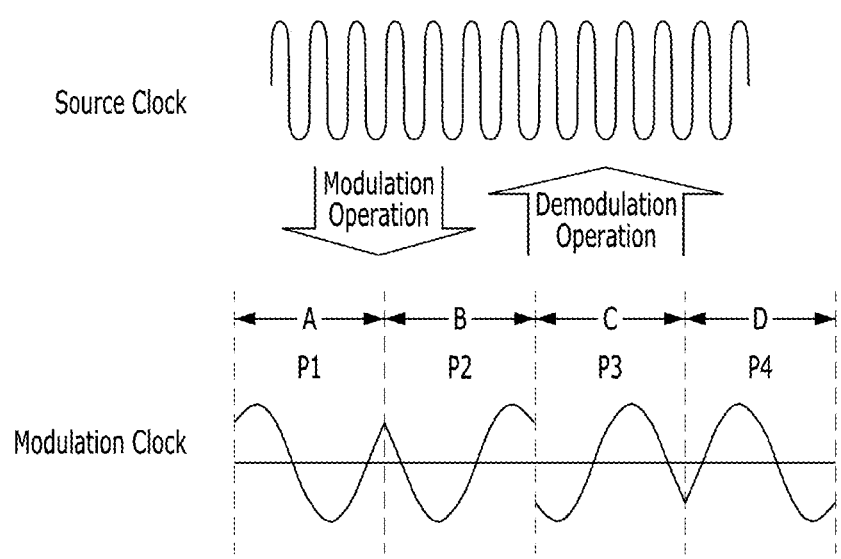

Meanwhile, FIGS. 3, 5, and 6 may be referred to in order to describe a modulation operation and a demodulation operation based on a specific scheme.

First of all, referring to FIGS. 3 and 5, the modulation operation and the demodulation operation based on the specific scheme may mean frequency modulation and frequency demodulation, respectively. In other words, the modulation operation based on the specific scheme may indicate a modulation operation using N different frequencies. Herein, it is assumed that N is a natural number equal to or greater than 2, and it is assumed in FIG. 5 that N is 4.

To be specific, for example, the source clock SCCLK generated by the clock generator 1301 of the controller 130 may have a substantially uniform frequency.

The modulation circuit 1304 included in the controller 130 may perform a frequency modulation operation of modulating the frequency of the source clock SCCLK to generate the first modulation clock DCLK1 that is divided into four modulation sections A, B, C, and D. Herein, the four modulation sections A, B, C, and D included in the first modulation clock DCLK1 may be detected according to their frequency differences. For example, the D section among the four modulation sections included in the first modulation clock DCLK1 may have substantially the same frequency as the source clock SCCLK, and the C section may have a lower frequency than the D section, and the B section may have a lower frequency than the C section, and the section A may have a lower frequency than the section B. That is, according to the embodiment shown in FIG. 5, frequencies may increase in the order of the A section, the B section, the C section, and the D section in the first modulation clock DCLK1. However, embodiments of the present disclosure are not limited thereto. For example, frequencies may decrease in the order of the A section, the B section, the C section, and the D section in the first modulation clock DCLK1. In an embodiment, the first modulation clock DCLK1 may include an odd number of modulation sections, rather than an even number (e.g., 4 in FIG. 5) of modulation sections. In an embodiment, a plurality of modulation sections of the first modulation clock DCLK1 have respective frequencies that are spaced apart at regular intervals.

Since the loop-back operation circuit 1501 included in the memory device 150 loops back the first modulation clock DCLK1 so as to produce the second modulation clock DCLK2 and outputs the second modulation clock DCLK2 to the controller 130, the second modulation clock DCLK2 may also include four modulation sections A, B, C, and D. Therefore, the four modulation sections A, B, C, and D included in the second modulation clock DCLK2 may also be detected according to their frequency differences.

The output circuit 1503 included in the memory device 150 may synchronize the read data RDDATA read from the memory cell region 1502 with each of the four modulation sections A, B, C, and D that are included in the second modulation clock DCLK2. Therefore, the value of the read data RDDATA may be determined based on each of the four modulation sections A, B, C, and D that are included in the second modulation clock DCLK2. For example, it may be assumed that the memory device 150 is a NAND flash memory and the read data RDDATA has a data size corresponding to four pages. In this case, a first portion of the read data RDDATA read from the first page (not shown) of the memory cell region 1502 included in the memory device 150 may be first section data that are synchronized with the A section among the four modulation sections A, B, C and D that are included in the second modulation clock DCLK2. A second portion of the read data RDDATA read from the second page (not shown) may be second section data that are synchronized with the B section. A third portion of the read data RDDATA read from the third page (not shown) may be third section data that are synchronized with the C section. A fourth portion of the read data RDDATA read from the fourth page (not shown) may be fourth section data that are synchronized with the D section.

To sum up, the read data RDDATA may include first to fourth section data. Also, the first to fourth section data included in the read data RDDATA may be respectively synchronized to the four modulation sections A, B, C, and D included in the second modulation clock DCLK2. Herein, since the four modulation sections A, B, C, and D included in the second modulation clock DCLK2 have different frequencies, the first to fourth section data included in the read data RDDATA may be in a state that they are respectively synchronized with clocks of different frequencies.

The input circuit 1302 included in the controller 130 may receive the read data RDDATA transferred from the memory device 150 in response to the second modulation clock DCLK2 which is transferred from the memory device 150.

The verification circuit 1305 included in the controller 130 may perform a frequency demodulation operation on the second modulation clock DCLK2 transferred from the memory device 150 to detect the four modulation sections A, B, C, and D included in the second modulation clock DCLK2. In other words, the verification circuit 1305 may detect a change in frequency by performing a frequency demodulation operation onto the second modulation clock DCLK2 so as to produce a detection result, and may detect the four consecutive modulation sections A, B, C, and D that are included in the second modulation clock DCLK2 based on the detection result. In an embodiment, the verification circuit 1305 may be implemented as a circuit including a frequency demodulation circuit whose transfer function is sensitive to frequency. For example, the verification circuit 1305 may include a frequency to voltage converter generating an output voltage that is proportional to a frequency of an input signal. The verification circuit 1305 may detect the first to fourth section data included in the read data RDDATA through an operation of detecting the four consecutive modulation sections A, B, C, and D that are included in the second modulation clock DCLK2 by each section. In other words, the verification circuit 1305 may determine a first portion of the read data RDDATA corresponding to the A section among the four consecutive modulation sections A, B, C, and D that are included in the second modulation clock DCLK2 as first section data, determine a second portion of the read data RDDATA corresponding to the B section as second section data, determine a third portion of the read data RDDATA corresponding to the C section as third section data, and determine a fourth portion of the read data RDDATA corresponding to the D section as fourth section data.

Also, the verification circuit 1305 may verify the reliability of the read data RDDATA for each modulation section by detecting the first to fourth section data that are included in the read data RDDATA. In other words, the verification circuit 1305 may independently verify whether each of the first to fourth section data that are included in the read data RDDATA is in a normal state or not.

For example, some bits included in the second section data among the first to fourth section data that are included in the read data RDDATA may be lost in the process of being transferred from the memory device 150 to the controller 130.

Herein, the verification circuit 1305 may verify that some bits of the second section data are missing among the first to fourth section data that are included in the read data RDDATA and the second section data are not in a normal state. Of course, the verification circuit 1305 may be able to verify that the remaining section data, which include the first, third, and fourth section data, are in a normal state. The verification circuit 1305 may generate verification information VRINFO, which represents a verification result that the second section data among the first to fourth section data included in the read data RDDATA are not in a normal state while the remaining first, third, and fourth section data are in a normal state and output the verification information VRINFO to the internal circuit 1303.

Accordingly, the internal circuit 1303 may be informed that the second section data among the first to fourth section data included in the read data RDDATA are not in a normal state in response to the verification information VRINFO outputted from the verification circuit 1305. As a result, the internal circuit 1303 may request the memory device 150 to selectively re-read and output only the second section data from the memory cell region 1502. For example, the internal circuit 1303 may generate a read command (not shown) for selectively re-reading only the second section data and transfer the read command to the memory device 150.

Herein, the internal circuit 1303 may stop the frequency modulation operation of the modulation circuit 1304 and the frequency demodulation operation of the verification circuit 1305 from a first time when the internal circuit 1303 requests the memory device 150 to perform a re-read operation to a second time when the re-read operation ends.

To be specific, the internal circuit 1303 may generate an operation selection signal OPC having a first value when the internal circuit 1303 requests the memory device 150 to re-read the second section data, and transfer the generated operation selection signal OPC to the modulation circuit 1304 and the verification circuit 1305. Herein, the modulation circuit 1304 may stop performing a frequency modulation operation in response to the operation selection signal OPC having the first value transferred from the internal circuit 1303. Similarly, the verification circuit 1305 may stop performing a frequency demodulation operation in response to the operation selection signal OPC having the first value transferred from the internal circuit 1303.

Herein, since the modulation circuit 1304 stops a frequency modulation operation, the source clock SCCLK generated by the clock generator 1301 may be transferred to the memory device 150 through the modulation circuit 1304. In this case, the loop-back operation circuit 1501 included in the memory device 150 may loop back the source clock SCCLK transferred from the controller 130 to transfer the result to the output circuit 1503 included in the controller 130 and the memory device 150. Accordingly, the output circuit 1503 may output the second section data that are re-read from the memory cell region 1502 to the controller 130 in synchronization with the source clock SCCLK.

Also, the input circuit 1302 included in the controller 130 may receive the second section data that are re-read from the memory device 150 in response to the source clock SCCLK transferred from the memory device 150.

The verification circuit 1305 included in the controller 130 may verify again whether the second section data that are re-read from the memory device 150 is in a normal state or not. In this case, the verification circuit 1305 may keep stopping the frequency demodulation operation since the modulation circuit 1304 stops the frequency modulation operation. Therefore, the verification circuit 1305 may verify whether the second section data transferred from the memory device 150 is in a normal state or not in response to the source clock SCCLK.

As a result of re-verifying the second section data transferred from the memory device 150 in the verification circuit 1305, when the second section data are in a normal state, verification information VRINFO indicating that the second section data are in a normal state may be generated and outputted to the internal circuit 1303. Accordingly, the internal circuit 1303 may combine the second section data that are re-read and verified to be in a normal state with the first, third, and fourth section data that are previously read and verified to be in a normal state, and thus it may be regarded that the read data RDDATA in which the first to fourth section data are all verified to be in a normal state are received. Therefore, the internal circuit 1303 may use the read data RDDATA whose first to fourth section data are all verified to be in a normal state according to a predetermined purpose. Also, the internal circuit 1303 may generate an operation selection signal OPC having a second value when the read data RDDATA whose first to fourth section data are all verified to be in a normal state are received, and transfer the generated operation selection signal OPC to the modulation circuit 1304 and the verification circuit 1305. Herein, the modulation circuit 1304 may resume performing the frequency modulation operation in response to the operation selection signal OPC having the second value transferred from the internal circuit 1303. Similarly, the verification circuit 1305 may resume performing the frequency demodulation operation in response to the operation selection signal OPC having the second value transferred from the internal circuit 1303.

When the verification circuit 1305 re-verifies the second section data transferred from the memory device 150 and it turns out that the second section data are still in an abnormal state, verification information VRINFO representing that the second section data are in an abnormal state may be generated again and outputted to the internal circuit 1303. In this case, the internal circuit 1303 may attempt a repetitive read operation of requesting the memory device 150 to selectively re-read and output the second section data or attempt a recovery operation of recovering the abnormal second section data into a normal state through an error correction code unit (e.g., the error correction code unit 138 in FIG. 1). Herein, which of the repetitive read operation and the recovery operation is to be performed in the internal circuit 1303 may be predetermined according to a designer's selection.

Referring to FIGS. 3 and 6, the modulation operation and the demodulation operation based on a specific scheme may mean phase modulation and phase demodulation, respectively. In other words, the modulation operation based on a specific scheme may mean a modulation operation using N different phases. Herein, it is assumed that N is a natural number equal to or greater than 2 and it is assumed in FIG. 6 that N is 4.

To be specific, for example, it may be regarded that the phase of the source clock SCCLK generated in the clock generator 1301 of the controller 130 has a reference phase.

The modulation circuit 1304 included in the controller 130 may perform a phase modulation operation of modulating the phase of the source clock SCCLK to generate a first modulation clock DCLK1 that is divided into four modulation sections A, B, C, and D. In this case, the four modulation sections A, B, C, and D included in the first modulation clock DCLK1 may be divided according to phase differences. For example, the section A among the four modulation sections included in the first modulation clock DCLK1 may have a phase difference of P1 with respect to the source clock SCCLK, the section B may have a phase difference of P2 with respect to the source clock SCCLK, the C section may have a phase difference of P3 with respect to the source clock SCCLK, and the section D may have a phase difference of P4 with respect to the source clock SCCLK. In an embodiment, the verification circuit 1305 may be implemented as a circuit including a phase demodulation circuit. In an embodiment, P1, P2, P3, and P4 may be approximately 45 degrees, 135 degrees, 225 degrees, and 315 degrees, respectively.

To sum up, the modulation operation and the demodulation operation based on a specific scheme may represent frequency modulation and frequency demodulation, respectively, as described earlier with reference to FIGS. 3 and 5. Also, the modulation operation and the demodulation operation based on a specific scheme may mean phase modulation and phase demodulation, respectively, that are described with reference to FIGS. 3 and 6. As described above, the modulation operation and the demodulation operation based on a specific scheme may have a difference as shown in FIGS. 5 and 6, but the controller 130 and the memory device 150 of FIG. 3 operate similarly in that the controller 130 generates a modulation clock DCLK1 including N modulation sections by performing a modulation operation onto the source clock SCCLK, receives the read data RDDATA in synchronization with the modulation clock DCLK2, and performs an operation of verifying the reliability of the read data RDDATA corresponding to the N modulation sections that are included in the modulation clock DCLK2 by performing a demodulation operation. Therefore, detailed descriptions on the operation of the controller 130 and the memory device 150 of FIG. 3 based on the scheme of FIG. 6 that are similar to those described above with reference to FIGS. 3 and 5 may be omitted in the interest of brevity.

Figure 4:
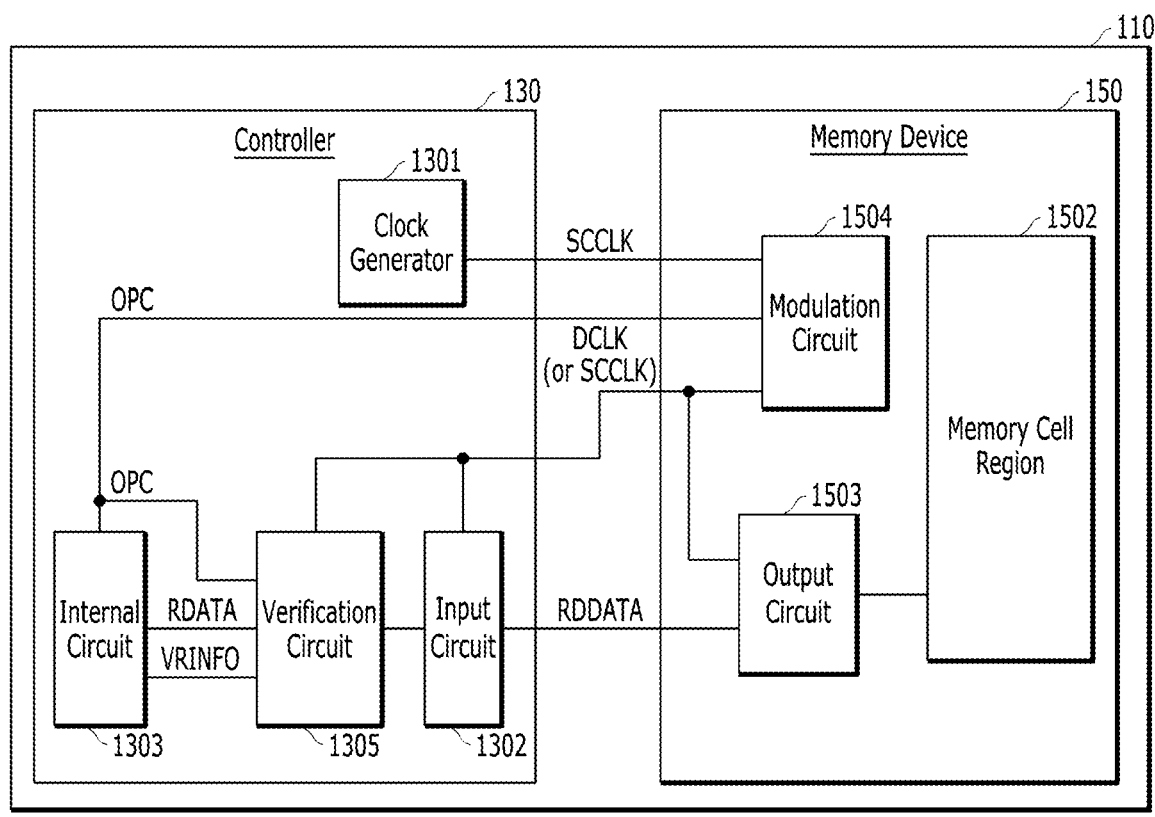
FIG. 4 is a block diagram illustrating an operation of a memory system in accordance with an embodiment of the present disclosure.

FIG. 4 is a block diagram illustrating an operation of a memory system 110 in accordance with an embodiment of the present disclosure.

Referring to FIG. 4, the memory system 110 may include a controller 130 and a memory device 150. Herein, the controller 130 may include a clock generator 1301, an input circuit 1302, an internal circuit 1303, and a verification circuit 1305. The memory device 150 may include a modulation circuit 1504, a memory cell region 1502, and an output circuit 1503. Herein, the clock generator 1301, the input circuit 1302, and the verification circuit 1305 included in the controller 130 may be constituent elements corresponding to the memory interface unit 142 which is described as a constituent element included in the controller 130 in FIG. 1. Also, the internal circuit 1303 included in the controller 130 may be a constituent element corresponding to one or more among the host interface unit 132, the processor 134, the error correction code (ECC) unit 138, the power management unit (PMU) 140, and the memory 144, which are described as the constituent elements included in the controller 130 in FIG. 1. The memory cell region 1502 included in the memory device 150 may be a constituent element corresponding to a plurality of memory blocks 152, 154, and 156 described as being included in the memory device 150 in FIG. 1. Also, FIG. 4 shows a structure in which one memory device 150 is included in the memory system 110. However, embodiments of the present disclosure are not limited thereto. For example, a plurality of memory devices may be included in the memory system 110.

To be specific, the memory device 150 may include a memory cell region 1502 for storing data, and generate a modulation clock DCLK including N modulation sections by performing a modulation operation on an externally inputted source clock SCCLK according to a specific scheme. Herein, N may be a natural number equal to or greater than 2. Also, the memory device 150 may output the read data RDDATA that are read from the memory cell region 1502 in synchronization with the modulation clock DCLK.

To be more specific, the memory device 150 may read the read data RDDATA from the memory cell region 1502 in response to a read command (not shown) inputted from the controller 130. Also, the memory device 150 may generate a modulation clock DCLK including N modulation sections by performing a modulation operation on the source clock SCCLK according to a specific scheme. Also, the memory device 150 may synchronize the read data RDDATA with the modulation clock DCLK and output the result to the controller 130. Also, the modulation circuit 1504 included in the memory device 150 may generate a modulation clock DCLK by performing a modulation operation on the source clock SCCLK according to a specific scheme and output the generated modulation clock DCLK to the controller 130.

The output circuit 1503 included in the memory device 150 may read the read data RDDATA from the memory cell region 1502 in synchronization with the modulation clock DCLK and output the read data RDDATA to the controller 130.

The controller 130 may output the source clock SCCLK to the memory device 150, and then receive the read data RDDATA transferred from the memory device 150 in response to the modulation clock DCLK transferred from the memory device 150. Also, the controller 130 may verify the reliability of the read data RDDATA corresponding to the N modulation sections that are included in the modulation clock DCLK for each modulation section through a demodulation operation according to a specific scheme.

Herein, the operation of verifying the reliability of the read data RDDATA in the controller 130 may include an operation of verifying whether abnormal data are included in the read data RDDATA inputted through the input circuit 1302. In other words, the controller 130 may divide the modulation clock DCLK into N modulation sections through a demodulation operation based on a specific scheme, and verify whether there are abnormal section data among the N section data (not shown) included in the read data RDDATA and respectively corresponding to the N modulation sections in the modulation clock DCLK.

To be more specific, the clock generator 1301 included in the controller 130 may generate a source clock SCCLK. The modulation circuit 1504 included in the memory device 150 may receive the source clock SCCLK generated by the clock generator 1301, perform a modulation operation on the source clock SCCLK according to a specific scheme so as to generate the modulation clock DCLK including the N modulation sections, and output the modulation clock DCLK to the controller 130. In an embodiment, the modulation circuit 1504 is implemented to include a frequency modulation circuit. For example, the modulation circuit 1504 includes a frequency modulator that receives a DC input and generates the modulation signal DCLK in response to the DC input by varying a value of the DC input to generate the N modulation sections of the modulation signal DCLK having different frequencies. The output circuit 1503 included in the memory device 150 may output the read data RDDATA to the controller 130 in response to the modulation clock DCLK. The input circuit 1302 included in the controller 130 may receive the read data RDDATA transferred from the memory device 150 in response to the modulation clock DCLK transferred from the memory device 150. Also, the verification circuit 1305 included in the controller 130 may perform a demodulation operation on the modulation clock DCLK according to a specific scheme, and verify the reliability of the read data RDDATA corresponding to the N modulation sections included in the modulation clock DCLK for each modulation section.

The internal circuit 1303 included in the controller 130 may perform an operation for securing the reliability of the read data RDDATA inputted through the input circuit 1302 based on the verification information VRINFO outputted from the verification circuit 1305, and then use the read data RDDATA inputted through the input circuit 1302 according to a predetermined purpose.

Herein, the operation for securing the reliability of the read data RDDATA inputted through the input circuit 1302 may be an operation for requesting the memory device 150 to selectively re-read and output only abnormal section data among N section data included in the read data RDDATA respectively corresponding to the N modulation sections included in the modulation clock DCLK. In other words, when it is assumed that the read data RDDATA have a predetermined size, the operation may be an operation for requesting the memory device 150 to re-read only some section data that are abnormal among the N section data included in the read data RDDATA. For example, although not illustrated in detail in the drawing, the internal circuit 1303 may generate a read command for selectively re-reading abnormal section data and transfer the read command to the memory device 150. Subsequently, when some section data that are requested to be re-read are transferred to the controller 130 and the reliability of the section data is verified by the verification circuit 1305, the internal circuit 1303 may use the read data RDDATA including the section data that are re-read for a predetermined purpose. For example, referring back to FIG. 1, the internal circuit 1303 may perform an operation for outputting read data RDDATA to the host 102 communicating with the host interface unit 132 and the processor 134.

Meanwhile, FIGS. 4, 5, and 6 may be referred to in order to describe a modulation operation and a demodulation operation based on a specific scheme.

First, referring to FIGS. 4 and 5, the modulation operation and the demodulation operation based on the specific scheme may refer to frequency modulation and frequency demodulation, respectively. In other words, the modulation operation based on the specific scheme may mean a modulation operation using N different frequencies. Herein, it is assumed that N is a natural number equal to or greater than 2, and it is assumed in FIG. 5 that N is 4.

To be specific, for example, the source clock SCCLK generated by the clock generator 1301 of the controller 130 may have a substantially uniform frequency.

The modulation circuit 1504 included in the memory device 150 may perform a frequency modulation operation of modulating the frequency of the source clock SCCLK inputted from the controller 130 to generate the modulation clock DCLK that is divided into four modulation sections A, B, C, and D. The four modulation sections A, B, C, and D included in the modulation clock DCLK may be detected according to their frequency differences. For example, the section D of the four modulation sections included in the modulation clock DCLK may have substantially the same frequency as the source clock SCCLK, and the section C may have a lower frequency than the section D, and the section B may have a lower frequency than the section C, and the section A may have a lower frequency than the section B.

The output circuit 1503 included in the memory device 150 may output the read data RDDATA read from the memory cell region 1502 in synchronization with the respective four modulation sections A, B, C, and D included in the modulation clock DCLK. Therefore, the value of the read data RDDATA may be determined according to each of the four modulation sections A, B, C, and D included in the modulation clock DCLK. For example, it may be assumed that the memory device 150 is a NAND flash memory and the read data RDDATA have a data size corresponding to four pages. In this case, a first portion of the read data RDDATA read from the first page (not shown) of the memory cell region 1502 included in the memory device 150 may be first section data that are synchronized with the section A among the four modulation sections A, B, C, and D included in the modulation clock DCLK. A second portion of the read data RDDATA read from the second page (not shown) may be second section data that are synchronized with the section B. A third portion of the read data RDDATA read from the third page (not shown) may be third section data that are synchronized with the section C. A fourth portion of the read data RDDATA read from the fourth page (not shown) may be fourth section data that are synchronized with the section D.

To sum up, the read data RDDATA may include the first to fourth section data. Also, the first to fourth section data included in the read data RDDATA may be respectively synchronized with the four modulation sections A, B, C, and D included in the modulation clock DCLK. Herein, since the four modulation sections A, B, C, and D included in the modulation clock DCLK have different frequencies, the first to fourth section data included in the read data RDDATA may be synchronized with clocks of different frequencies, respectively.

The input circuit 1302 included in the controller 130 may receive the read data RDDATA transferred from the memory device 150 in response to the modulation clock DCLK transferred from the memory device 150.

The verification circuit 1305 included in the controller 130 may perform a frequency demodulation operation on the modulation clock DCLK transferred from the memory device 150, thereby providing four modulation sections A, B, C, and D. In other words, the verification circuit 1305 may detect a change in frequency by performing a frequency demodulation operation onto the modulation clock DCLK so as to produce a frequency change detection result. Based on the frequency change detection result, the four consecutive modulation sections A, B, C, and D that are included in the modulation clock DCLK may be distinguished. As such, the verification circuit 1305 may be able to detect the first to fourth section data that are included in the read data RDDATA through an operation of detecting the four consecutive modulation sections A, B, C, and D included in the modulation clock DCLK. To be specific, the verification circuit 1305 may detect a first portion of the read data RDDATA corresponding to the section A among the four consecutive modulation sections A, B, C, and D included in the modulation clock DCLK as the first section data, detect a second portion of the read data RDDATA corresponding to the section B as the second section data, detect a third portion of the read data RDDATA corresponding to the section C as the third section data, and detect a fourth portion of the read data RDDATA corresponding to the section D as the fourth section data.

Also, the verification circuit 1305 may be able to verify the reliability of the read data RDDATA for each modulation section by detecting the first to fourth section data included in the read data RDDATA. In other words, the verification circuit 1305 may be able to independently verify whether each of the first to fourth section data included in the read data RDDATA is in a normal state or not.

For example, some bits included in the second section data among the first to fourth section data included in the read data RDDATA may be lost in the process of being transferred from the memory device 150 to the controller 130.

In this case, the verification circuit 1305 may be able to verify that some bits of the second section data are missing among the first to fourth section data included in the read data RDDATA and thus the second section data are not in a normal state. Of course, the verification circuit 1305 may be able to verify that the remaining section data, i.e., the first, third and fourth section data, are in a normal state. The verification circuit 1305 may generate verification information VRINFO that represents the result verifying that the second section data are not in a normal state while the remaining first, third, and fourth section data are in a normal state, and output the generated verification information VRINFO to the internal circuit 1303.

Accordingly, the internal circuit 1303 may determine that the second section data among the first to fourth section data included in the read data RDDATA are not in a normal state based on the verification information VRINFO outputted from the verification circuit 1305. Subsequently, the internal circuit 1303 may request the memory device 150 to selectively re-read and output only the second section data from the memory cell region 1502. For example, the internal circuit 1303 may generate a read command (not shown) for selectively re-reading only the second section data and transfer the read command to the memory device 150.

Herein, the internal circuit 1303 may stop the frequency modulation operation of the modulation circuit 1504 included in the memory device 150 and the frequency demodulation operation of the verification circuit 1305 included in the controller 130 from the moment when it requests the memory device 150 to perform the re-read operation until the re-read operation is complete.

To be specific, the internal circuit 1303 may generate an operation selection signal OPC having the first value when the internal circuit 1303 requests the memory device 150 to re-read the second section data, and then transfer the generated operation selection signal OPC to the modulation circuit 1504 and the verification circuit 1305. Herein, the modulation circuit 1504 included in the memory device 150 may stop performing the frequency modulation operation in response to the operation selection signal OPC having the first value transferred from the internal circuit 1303. Also, the verification circuit 1305 may stop performing the frequency demodulation operation in response to the operation selection signal OPC having the first value transferred from the internal circuit 1303.

Herein, since the modulation circuit 1504 has stopped the frequency modulation operation, the modulation circuit 1504 included in the memory device 150 may transfer the source clock SCCLK generated by the clock generator 1301 included in the controller 130 back to the controller 130. To be specific, the modulation circuit 1504 included in the memory device 150 may transfer the source clock SCCLK from the controller 130 to the output circuit 1503 included in the memory device 150 and the controller 130. Accordingly, the output circuit 1503 may output the second section data re-read from the memory cell region 1502 to the controller 130 in synchronization with the source clock SCCLK.

Also, the input circuit 1302 included in the controller 130 may receive the second section data that are re-read from the memory device 150 in response to the source clock SCCLK which is transferred from the memory device 150.

The verification circuit 1305 included in the controller 130 may verify again whether the second section data re-read from the memory device 150 are in a normal state or not. Herein, the verification circuit 1305 may keep stopping the frequency demodulation operation since the moment when the modulation circuit 1504 stops the frequency modulation operation. Therefore, the verification circuit 1305 may verify whether the second section data transferred from the memory device 150 are in a normal state or not in response to the source clock SCCLK.

As a result of verifying the second section data transferred from the memory device 150 in the verification circuit 1305, when it turns out that the second section data are in a normal state, verification information VRINFO indicating that the second section data are in a normal state may be generated and outputted to the internal circuit 1303. Accordingly, the internal circuit 1303 may combine the second section data that are re-read and verified to be in a normal state with the first, third, and fourth section data that are previously read and verified to be in a normal state. As a result, the internal circuit 1303 may receive the read data RDDATA whose first to fourth section data are all verified to be in a normal state. Therefore, the internal circuit 1303 may be able to use the read data RDDATA whose first to fourth section data included therein are all verified to be in a normal state according to a predetermined purpose. Also, the internal circuit 1303 may generate an operation selection signal OPC having a second value when the read data RDDATA which is verified to have all the first to fourth section data in a normal state and transfer the generated operation selection signal OPC to the modulation circuit 1504 included in the memory device 150 and the verification circuit 1305 included in the controller 130. Herein, the modulation circuit 1504 included in the memory device 150 may resume performing the frequency modulation operation in response to the operation selection signal OPC having the second value transferred from the internal circuit 1303. Also, the verification circuit 1305 included in the controller 130 may resume performing the frequency demodulation operation in response to the operation selection signal OPC having the second value transferred from the internal circuit 1303.

Herein, although the operation selection signal OPC is illustrated as being directly inputted to the modulation circuit 1504 included in the memory device 150, this is because the drawing is briefly illustrated to facilitate understanding of embodiments of the present disclosure. However, embodiments of the present disclosure are not limited thereto. For example, the operation selection signal OPC generated by the internal circuit 1303 may be transferred to the modulation circuit 1504 included in the memory device 150 in a form that the operation selection signal OPC is included in a particular command transferred from the controller 130 to the memory device 150.

As a result of re-verifying the second section data transferred from the memory device 150 in the verification circuit 1305, when the second section data are still in an abnormal state, verification information VRINFO indicating that the second section data are in an abnormal state is re-generated and outputted to the internal circuit 1303. In this case, the internal circuit 1303 may attempt a repetitive read operation of requesting the memory device 150 to selectively re-read and output the second section data, and may attempt a recovery operation of recovering the abnormal second section data into a normal state through an error correction code unit (e.g., the error correction code unit 138 in FIG. 1) that may be included therein. Herein, which operation between the repetitive read operation and the recovery operation is to be performed in the internal circuit 1303 may be predetermined according to a designer's selection.

Referring to FIGS. 4 and 6, the modulation operation and the demodulation operation based on a specific scheme may mean phase modulation and phase demodulation, respectively. In short, the modulation operation based on a specific scheme may mean a modulation operation using N different phases. Herein, it is assumed that N is a natural number equal to or greater than 2 and it is assumed in FIG. 6 that N is 4.

To be specific, for example, it may be regarded that the phase of the source clock SCCLK generated in the clock generator 1301 of the controller 130 has a reference phase.

The modulation circuit 1504 included in the memory device 150 may generate a modulation clock DCLK that is divided into four phase modulation operations A, B, C, and D by performing a phase modulation operation of modulating the phase of the source clock SCCLK inputted from the controller 130. Herein, the four modulation sections A, B, C, and D included in the modulation clock DCLK may be detected according to their phase differences. For example, the section A among the four modulation sections included in the modulation clock DCLK may have a phase difference of P1 with respect to the source clock SCCLK, the section B may have a phase difference of P2 with respect to the source clock SCCLK, the section C may have a phase difference of P3 with respect to the source clock SCCLK, and the section D may have a phase difference of P4 with respect to the source clock SCCLK. In an embodiment, P1, P2, P3, and P4 may be approximately 45 degrees, 135 degrees, 225 degrees, and 315 degrees, respectively.

To sum up, the modulation operation and the demodulation operation based on a specific scheme may refer to frequency modulation and frequency demodulation, respectively, which are described earlier with reference to FIGS. 4 and 5. Also, the modulation operation and the demodulation operation based on a specific scheme may refer to phase modulation and phase demodulation, respectively, which are described with reference to FIGS. 4 and 6. As described above, although the modulation operation and the demodulation operation based on a specific scheme may be different from each other, as shown in FIGS. 5 and 6, the controller 130 and the memory device 150 of FIG. 4 operate similarly in that after the memory device 150 generates the modulation clock DCLK1 including the N modulation sections by performing a modulation operation on the source clock SCCLK, the controller 130 receives the read data RDDATA transferred in a state synchronized to the modulation clock DCLK2 and performs an operation of verifying the reliability of the read data RDDATA corresponding to the N modulation sections included in the modulation clock DCLK2 for each modulation section by performing a demodulation operation in the controller 130. Therefore, detailed descriptions on the operation of the controller 130 and the memory device 150 of FIG. 4 based on the scheme of FIG. 6 that are similar to those described above with reference to FIGS. 4 and 5 may be omitted in the interest of brevity.

According to the embodiment of the present disclosure described above, a data clock may be modulated through a modulation operation based on a specific scheme to generate a modulated data clock, and verification information for verifying the reliability of the read data RDDATA that are read from the memory device 150 may be included in the modulated data clock. Herein, since the read data are synchronized with the modulated data clock and outputted from the memory device 150, the verification information may be detected in the outside of the memory device by demodulating the modulated data clock through a demodulation operation based on a specific scheme. The reliability of the read data may be verified based on the detected verification information.

According to the embodiments of the present disclosure, verification information for verifying the reliability of read data that are read from a memory device may be included in a modulated data clock by modulating a data clock through a modulation operation based on a specific scheme and generating a modulated data clock.

Herein, since the read data are outputted from the memory device after being synchronized with the modulated data clock, the verification information may be obtained by demodulating the modulated data clock through a demodulation operation based on a specific scheme, and the reliability of the read data may be verified based on the obtained verification information. For example, a memory system according to an embodiment of the present disclosure may perform a modulation operation on a clock signal to generate a modulation clock signal that includes a plurality of modulation sections. When read data are read in synchronization with the modulation clock signal, the memory system performs a demodulation operation on the modulation clock signal to distinguish the plurality of modulation sections in the modulation clock signal, and thus a plurality of section data of the read data respectively corresponding to the plurality of modulation sections of the modulation clock signal can be distinguished. In other words, the memory system indexes the read data by the plurality of modulation sections of the modulation clock signal that respectively correspond to the plurality of section data of the read data. When specific section data of the read data includes one or more abnormal bits, the specific section data may be re-read from a memory cell region, rather than re-reading the entire read data, thereby increasing the efficiency of performing a read operation compared to a conventional memory system.

While specific embodiments of the present disclosure have been described, it will be apparent to those skilled in the art that various changes and modifications may be made without departing from the spirit and scope of the invention as defined in the following claims.

What is claimed is:

1. A memory system, comprising:
  a memory device including a memory cell region for storing data, the memory device looping back a first clock to generate a second clock and outputting read data that are read from the memory cell region in synchronization with the second clock; and
  a memory controller generating the first clock that includes a plurality of modulation sections by performing a modulation operation on a source clock according to a specific scheme, outputting the first clock to the memory device, and receiving the read data in response to the second clock,
  wherein the read data includes a plurality of section data corresponding to the plurality of modulation sections included in the second clock, respectively, and the memory controller verifies reliability of each of the plurality of section data included in the read data by performing a demodulation operation on the second clock according to the specific scheme, and
  wherein the memory controller includes: a clock generator generating the source clock, a modulation circuit generating the first clock by performing the modulation operation on the source clock, an input circuit receiving the read data in response to the second clock, and a verification circuit verifying the reliability of the read data inputted through the input circuit by performing the demodulation operation on the second clock.

2. The memory system of claim 1, wherein the modulation operation according to the specific scheme includes a frequency modulation operation using a plurality of frequencies, and
  wherein each of the plurality of modulation sections included in the first clock is detected based on a frequency difference.

3. The memory system of claim 1, wherein the modulation operation according to the specific scheme includes a phase modulation operation using a plurality of phases, and
  wherein each of the plurality of modulation sections included in the first clock is detected based on a phase difference.

4. The memory system of claim 1, wherein the memory controller detects the plurality of modulation sections included in the second clock through the demodulation operation, and verifies whether one or more abnormal section data exist among the plurality of section data.

5. The memory system of claim 4, wherein when the abnormal section data exist among the plurality of section data, the memory controller requests the memory device to selectively re-read and output the abnormal section data from the memory cell region.

6. A memory system, comprising:
  a memory device including a memory cell region for storing data, the memory device generating a modulation clock by performing a modulation operation on an externally inputted source clock according to a specific scheme, the modulation clock including a plurality of modulation sections, and outputting the modulation clock and read data that are read from the memory cell region in synchronization with the modulation clock; and
  a memory controller generating the source clock, outputting the source clock to the memory device, and receiving the read data in response to the modulation clock,
  wherein the read data includes a plurality of section data corresponding to the plurality of modulation sections included in the modulation clock, respectively, and the memory controller verifies reliability of each of the plurality of section data included in the read data by performing a demodulation operation on the modulation clock according to the specific scheme.

7. The memory system of claim 6, wherein the modulation operation according to the specific scheme includes a frequency modulation operation using a plurality of frequencies, and
  wherein each of the plurality of modulation sections included in the modulation clock is detected based on a frequency difference.

8. The memory system of claim 6, wherein the modulation operation according to the specific scheme includes a phase modulation operation using a plurality of phases, and
  wherein each of the plurality of modulation sections included in the modulation clock is detected based on a phase difference.

9. The memory system of claim 6, wherein the memory controller detects the plurality of modulation sections included in the modulation clock through the demodulation operation, and verifies whether one or more abnormal section data exist among the plurality of section data.

10. The memory system of claim 9, wherein when the abnormal section data exist among the plurality of section data, the memory controller requests the memory device to selectively re-read and output the abnormal section data from the memory cell region.

11. The memory system of claim 6, wherein the memory device further includes:
  a modulation circuit generating the modulation clock by performing the modulation operation on the source clock; and
  an output circuit outputting the read data read from the memory cell region in synchronization with the modulation clock.

12. The memory system of claim 11, wherein the memory controller includes:
  a clock generator generating the source clock;
  an input circuit receiving the read data in response to the modulation clock; and a verification circuit verifying the reliability of the read data inputted through the input circuit by performing the demodulation operation on the modulation clock.

13. A method for operating a memory system including a memory device having a memory cell region for storing data, the method comprising:
generating a modulation clock by performing a modulation operation on a source clock according to a specific scheme, the modulation clock including a plurality of modulation sections;
outputting read data that are read from the memory cell region in synchronization with the modulation clock from the memory device, the read data including a plurality of section data corresponding to the plurality of modulation sections included in the modulation clock, respectively; and
verifying reliability of each of the plurality of section data included in the read data by performing a demodulation operation on the modulation clock according to the specific scheme.

14. The method of claim 13, wherein the modulation operation according to the specific scheme includes a frequency modulation operation using a plurality of frequencies, and
wherein each of the plurality of modulation sections included in the modulation clock is detected based on a frequency difference.

15. The method of claim 13, wherein the modulation operation according to the specific scheme includes a phase modulation operation using a plurality of phases, and
wherein each of the plurality of modulation sections included in the modulation clock is detected based on a phase difference.

16. The method of claim 13, wherein the verifying of the reliability of the read data comprises:
detecting the plurality of modulation sections included in the modulation clock through the demodulation operation; and
verifying whether one or more abnormal section data exist among the plurality of section data.

17. The method of claim 16, further comprising when the abnormal section data exist among the plurality of section data in the verifying of the reliability of the read data, selectively re-reading the abnormal section data from the memory cell region and outputting the re-read abnormal section data from the memory device.

18. The method of claim 13, further comprising after generating the modulation clock outside the memory device, transferring the generated modulation clock to the memory device,
wherein the memory device loops back the transferred modulation clock and outputs the read data that are read from the memory cell region in synchronization with the modulation clock from the memory device.

19. The method of claim 13, further comprising:
generating the source clock outside the memory device; and
transferring the source clock to the memory device,
wherein the memory device generates the modulation clock based on the transferred source clock, and outputs the read data that are read from the memory cell region in synchronization with the modulation clock from the memory device.

* * * * *